United States Patent
Morita et al.

(10) Patent No.: US 8,563,152 B2
(45) Date of Patent: Oct. 22, 2013

(54) BATTERY CELL AND MONITORING DEVICE FOR ASSEMBLED BATTERY

(75) Inventors: Tsuyoshi Morita, Zama (JP); Atsushi Kawase, Sagamihara (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 358 days.

(21) Appl. No.: 13/058,650

(22) PCT Filed: Sep. 30, 2009

(86) PCT No.: PCT/IB2009/006999
§ 371 (c)(1),
(2), (4) Date: Feb. 11, 2011

(87) PCT Pub. No.: WO2010/038136
PCT Pub. Date: Apr. 8, 2010

(65) Prior Publication Data
US 2011/0135980 A1  Jun. 9, 2011

(30) Foreign Application Priority Data

Oct. 3, 2008  (JP) ................................. 2008-258811
Jun. 30, 2009 (JP) ................................. 2009-154990

(51) Int. Cl.
*H01M 10/48* (2006.01)

(52) U.S. Cl.
USPC ........................................................ 429/93

(58) Field of Classification Search
USPC ........................................................ 429/93
See application file for complete search history.

(56) References Cited

U.S. PATENT DOCUMENTS

| | | | |
|---|---|---|---|
| 5,849,426 A | 12/1998 | Thomas et al. | |
| 2001/0016279 A1 | 8/2001 | Shiota et al. | |
| 2001/0051298 A1 | 12/2001 | Hanafusa et al. | |
| 2005/0083021 A1* | 4/2005 | Mahon | 320/166 |
| 2006/0247715 A1 | 11/2006 | Youker | |
| 2007/0008666 A1 | 1/2007 | Morita et al. | |
| 2007/0024240 A1 | 2/2007 | Morita et al. | |
| 2008/0284375 A1* | 11/2008 | Nagaoka et al. | 320/116 |
| 2011/0004429 A1 | 1/2011 | Morita et al. | |

FOREIGN PATENT DOCUMENTS

| | | |
|---|---|---|
| CN | 1319262 A | 10/2001 |
| EP | 1 096 589 A1 | 5/2001 |
| EP | 1096589 A1 | 5/2001 |
| EP | 1 120 846 A1 | 8/2001 |
| EP | 1120846 A1 | 8/2001 |
| GB | 2 354 892 A | 4/2001 |
| GB | 2354892 A | 4/2001 |
| JP | 3293410 B2 | 12/1996 |
| JP | 10-294135 A | 11/1998 |
| JP | 2007-048746 | 2/2007 |
| JP | 2007-048746 A | 2/2007 |
| RU | 2242065 C2 | 12/2004 |
| RU | 2335042 C1 | 9/2008 |
| WO | 2009/107597 A1 | 9/2009 |

\* cited by examiner

*Primary Examiner* — Maria J Laios

(74) *Attorney, Agent, or Firm* — Young Basile

(57) ABSTRACT

A battery cell includes a power generating element, an electrode connected to the power generating element and configured to electrically connect the power generating element to outside, and an exterior member configured to cover the power generating element. The exterior member includes an insulating layer and a conductive layer, and the conductive layer includes a connection section electrically connected to the outs.

17 Claims, 13 Drawing Sheets

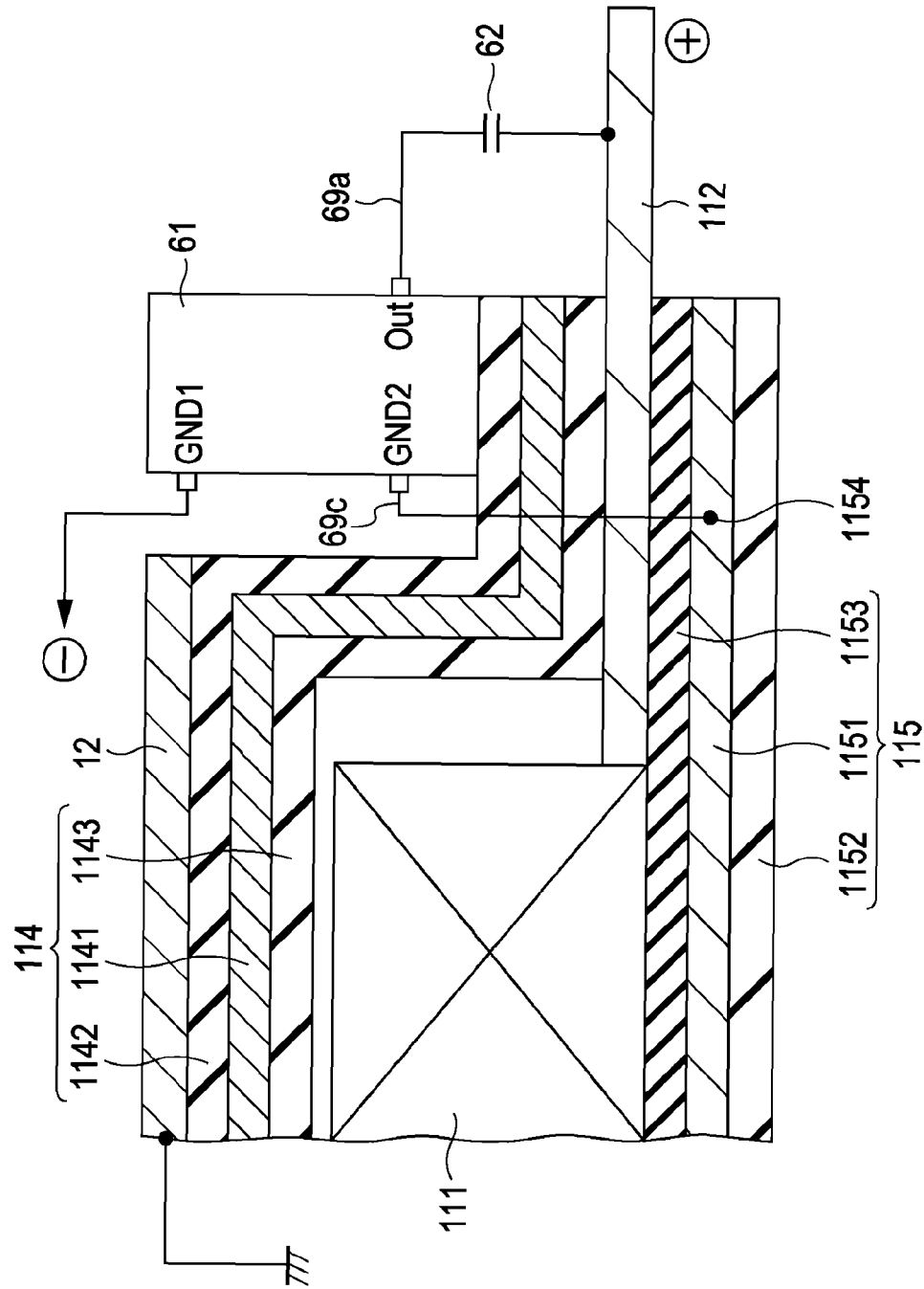

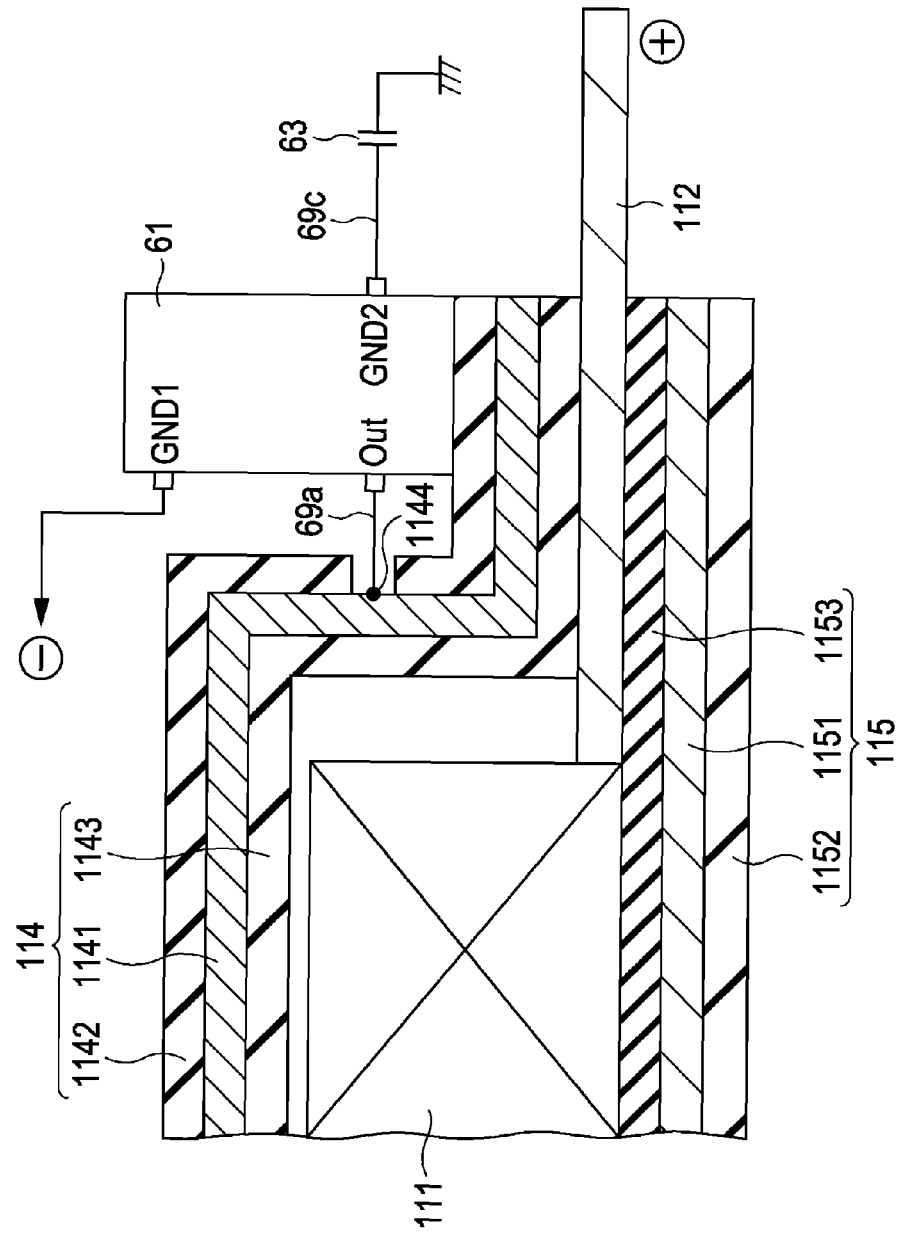

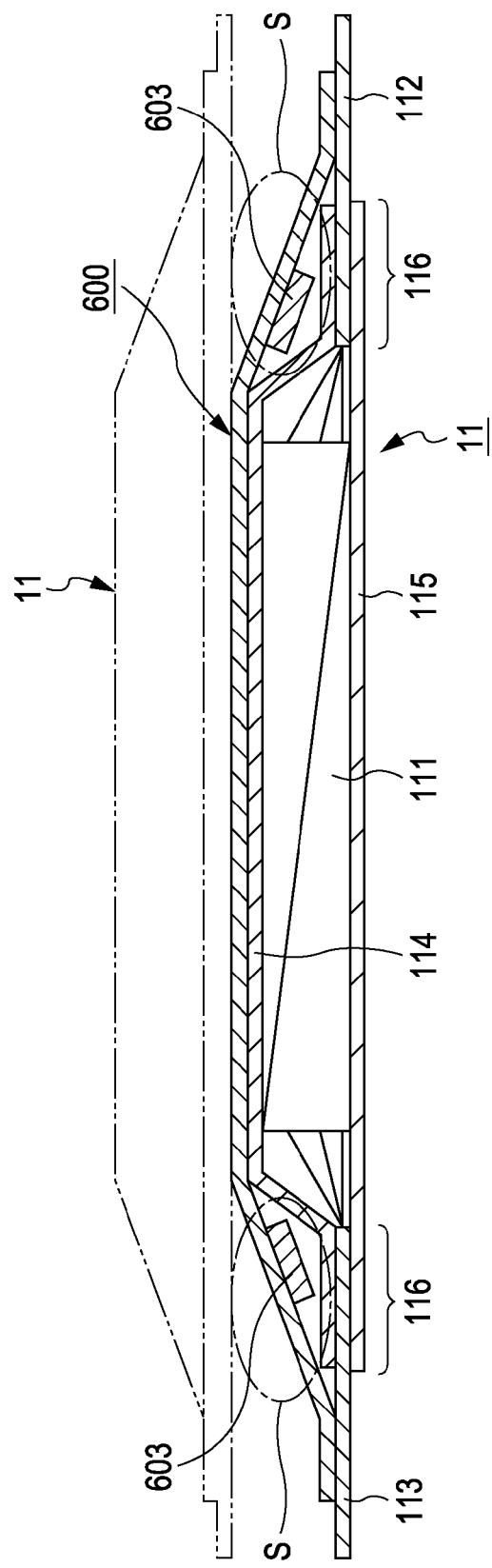

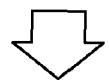

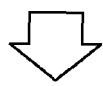

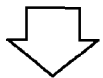

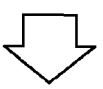
DISCONNECTION
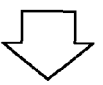
WELDED TO SINGLE BATTERY CELL

BATTERY CELL AND MONITORING DEVICE FOR ASSEMBLED BATTERY

CROSS-REFERENCE TO RELATED APPLICATIONS

This application claims priority from Japanese Patent Application Serial Nos. 2008-258811, filed Oct. 3, 2008, and 2009-154990, filed Jun. 30, 2009, each of which is incorporated herein in its entirety by reference.

TECHNICAL FIELD

The present invention relates to a battery having a plurality of battery cells connected to each other.

BACKGROUND

A device for monitoring a remaining battery capacity of an assembled battery (hereinafter also referred to simply as a "battery") having a plurality of battery cells connected in series and/or in parallel by detecting a voltage of each battery cell has been available (see, for example, Japanese Unexamined Patent Application Publication No. 8-339829).

However, since such a monitoring device is a low-voltage device, the monitoring device is connected to a high-voltage battery through a capacitor. Therefore, a capacitor is required in a circuit for monitoring the battery, which prevents the reduction in size of the battery.

In particular, as in an assembled battery, an increase in the number of battery cells requires a large number of capacitors, and there is a concern about the increase in occupied volume of the battery cells.

BRIEF SUMMARY

Embodiments of the invention to provide a battery cell and a monitoring device for an assembled battery in which the number of capacitors can be reduced.

A connection section that can be electrically connected to a member outside the battery cell is provided in a conductive layer of an exterior member including an insulating layer and the conductive layer.

As a result, the conductive layer can function as one terminal of a capacitor, and the insulating layer can function as a charge accumulation unit of the capacitor. Accordingly, a capacitor can be formed using the exterior member, resulting in the reduction in the number of capacitors required to construct the battery cell.

BRIEF DESCRIPTION OF THE DRAWINGS

The description herein makes reference to the accompanying drawings wherein like reference numerals refer to like parts throughout the several views, and wherein:

FIG. 9 is an enlarged cross-sectional view of a battery cell according to a second embodiment where the diagram illustrates a portion corresponding to the portion VIII in FIG. 6;

FIG. 10 is an enlarged cross-sectional view of a battery cell according to a third embodiment where the diagram illustrates a portion corresponding to the portion VIII in FIG. 6;

FIG. 13 is a cross-sectional view taken along the line XIII-XIII of FIG. 12.

DETAILED DESCRIPTION OF EMBODIMENTS OF THE INVENTION

Embodiments of the present invention will be described hereinafter with reference to the drawings.

Figure 1:
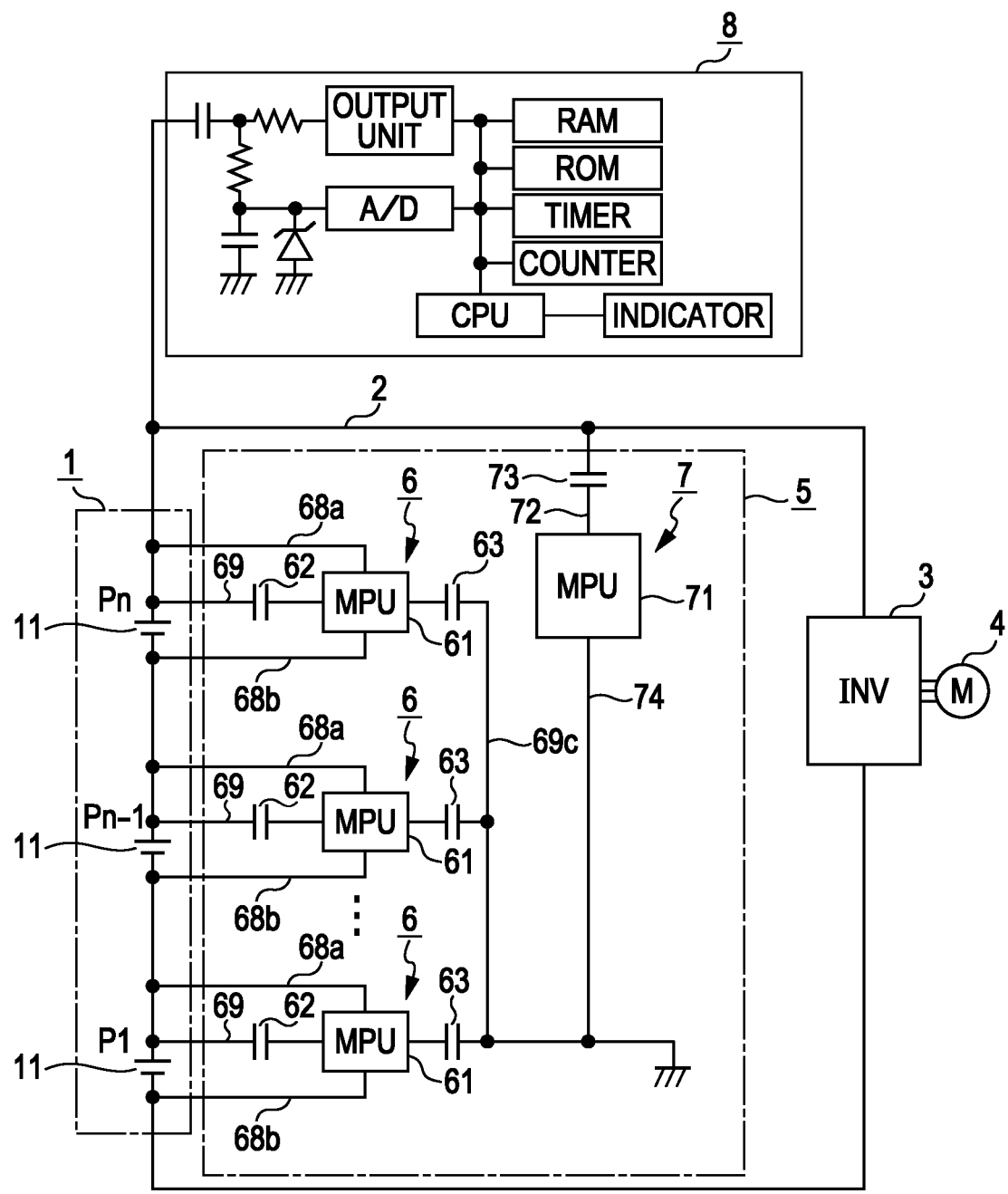
FIG. 1 is a block diagram illustrating a system for driving a motor according to an embodiment of the invention.

FIG. 1 is a block diagram illustrating a system for driving a motor 4, which includes an assembled battery 1 and a monitoring device 5 for the assembled battery 1, according to an embodiment of the invention. The assembled battery 1 includes a plurality of battery cells 11 connected in series, and an inverter 3 is connected to both poles of the assembled battery 1 through a power supply line 2. A direct-current (DC) current supplied from the assembled battery 1 is converted into an alternating-current (AC) current by the inverter 3, which may serve as a power converter, and is supplied to the motor (AC motor) 4 to drive the AC motor 4.

The assembled battery 1 illustrated in FIG. 1 is an example. A plurality of battery cells 11 may be connected in series and/or in parallel to each other to form an assembled battery 1. Furthermore, the assembled battery 1 may supply power to a DC motor. In this case, the inverter 3 can be omitted. The power may also be supplied to a load other than the motor 4.

The monitoring device 5 for the assembled battery 1 includes voltage detecting circuits 6 and a control circuit 7. Each of the voltage detecting circuits 6 detects a voltage across both terminals of one of the battery cells 11. The control circuit 7 receives voltage values of the individual battery cells 11, which are detected by the voltage detecting circuits 6, to determine the battery capacity of the assembled battery 1, and executes total control for preventing overcharge or overdischarge. The voltage detecting circuits 6 in the present example correspond to a detection unit according to one embodiment of the invention, and the control circuit 7 in the present example corresponds to a control unit according to one embodiment of the invention.

The voltage detecting circuits 6 in the present example are configured such that a voltage across the terminals of one battery cell 11 is detected using a single voltage detecting circuit 6. Alternatively, some battery cells 11 may be grouped, and the voltages of these battery cells 11 may be detected.

Each of the voltage detecting circuits 6 in the present example detects a voltage across the terminals of one corresponding battery cell 11 on the basis of a detection command signal sent from the control circuit 7 and sends a communication signal corresponding to a detected voltage value to the control circuit 7. Each of the voltage detecting circuits 6 further consumes the power of the corresponding battery cell 11 on the basis of a discharge command signal sent from the control circuit 7 to overcome variations in capacity of the battery cells 11 constituting the assembled battery 1.

In the monitoring device 5 in the present example, control commands or communication signals corresponding to detected voltage values, which are exchanged between the voltage detecting circuits 6 and the control circuit 7, are transmitted to and received from the control circuit 7 using the power supply line 2. Since a DC current flows in the power supply line 2, the communication signals may be AC signals in order to distinguish the communication signals from the DC current. Wires 68a and 68b illustrated in FIG. 1 represent wires for detecting voltages across the terminals of the battery cells 11, and wires 69 and 72 represent communication connection sections for transmitting and receiving signals between the voltage detecting circuits 6 and the control circuit 7.

Figure 2:
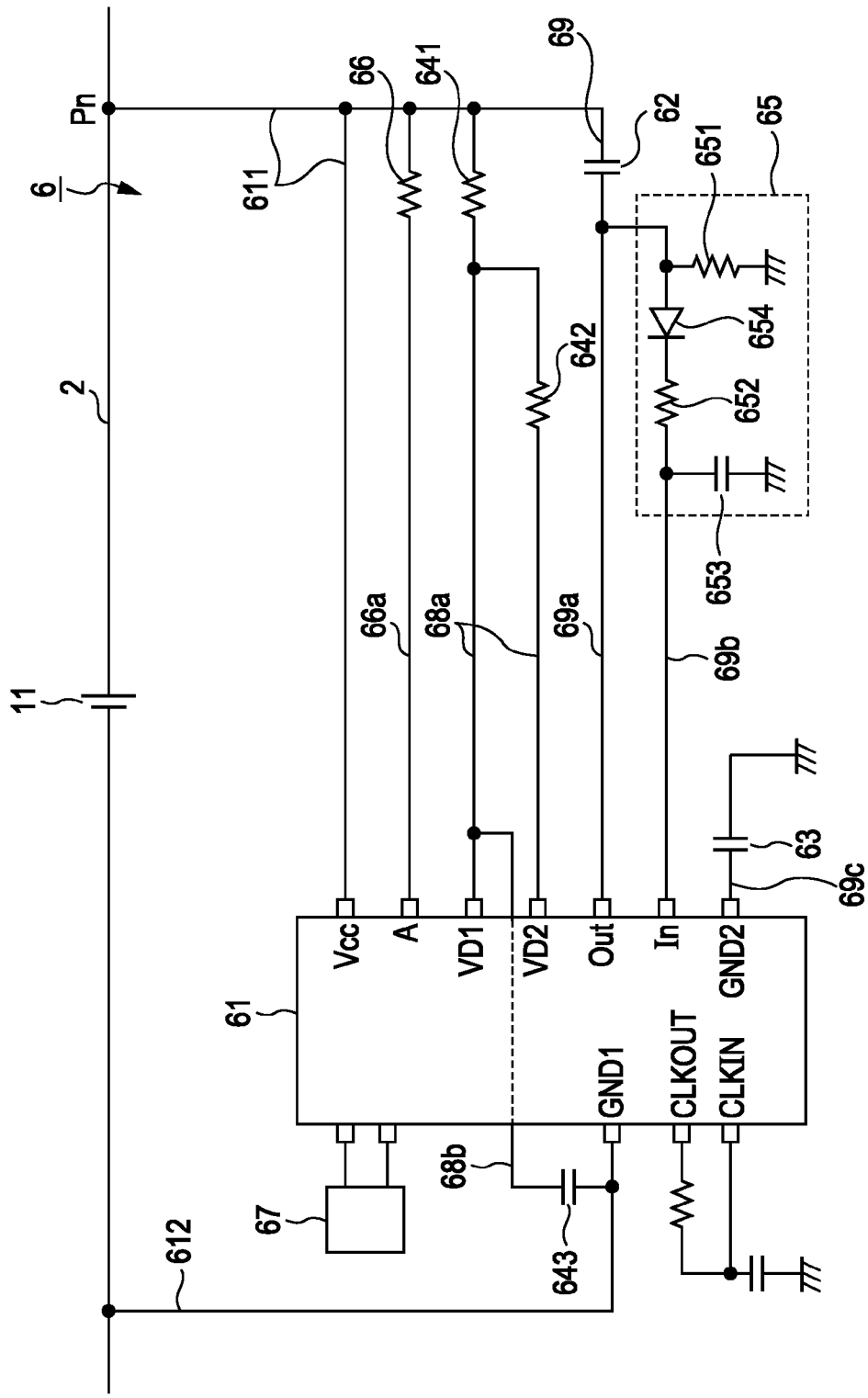
FIG. 2 is an electric circuit diagram illustrating a detection unit in a monitoring device shown in FIG. 1.

The above will now be described in more detail with respect to a specific configuration of the voltage detecting circuits 6. FIG. 2 is an electric circuit diagram illustrating one of the voltage detecting circuits 6 according to the present embodiment.

As illustrated in FIG. 2, the voltage detecting circuit 6 has wires 611 and 612 connected to the positive and negative terminals of the battery cell 11, respectively. The wire 611 is connected to a power supply input terminal Vcc of a microprocessor 61 (hereinafter referred to as a "MPU 61"), and the wire 612 is connected to a ground terminal GND1 of the MPU 61. Thus, driving power is supplied to the MPU 61.

One end of a wire 68a is connected to the wire 611 connected to the positive terminal of the battery cell 11 so that the wire 68a can be connected in parallel to the wire 611, and one end of a wire 68b is connected to the wire 612 connected to the negative terminal of the battery cell 11 so that the wire 68b can be connected in parallel to the wire 612. The wire 68a connected to the positive terminal of the battery cell 11 has resistors 641 and 642 for detecting a voltage of the battery cell 11, and the other end of the wire 68a is connected to voltage detection terminals VD1 and VD2 of the MPU 61. The wire 68b electrically connected to the negative terminal of the battery cell 11 has a capacitor 643, and the other end of the wire 68b is connected to the wire 68a connected to the voltage detection terminal VD1. The two resistors 641 and 642 and the capacitor 643 serve to detect a voltage across the terminals of the battery cell 11.

A detected voltage value across the terminals of the battery cell 11 is converted into an AC signal of a specific frequency band using an internal function of the MPU 61, and the AC signal is sent to the control circuit 7 from a communication signal output terminal Out, which will be described below, through wires 69a, 69 and 611 and the power supply line 2. In order to determine a reference potential Va of this AC communication signal, a wire 69c is connected to a communication-signal ground terminal GND2 of the MPU 61. The other end of wire 69c is connected to a ground point, such as a battery case for accommodating the assembled battery 1 in the present example, through a coupling capacitor 63. The ground point has the same potential for the individual battery cells 11. Thus, in the voltage detecting circuits 6, the reference potentials Va of AC communication signals sent from the communication signal output terminals Out to the control circuit 7 are equal to each other. A specific configuration of the coupling capacitor 63 will be described below.

Meanwhile, the wire 69 is connected in parallel to the wire 611 connected to the positive terminal of the battery cell 11, and a coupling capacitor 62 is provided in the wire 69. Further, the wire 69 connected to the other end of the coupling capacitor 62 is parallel branched into two wires 69a and 69b. The wire 69a is connected to the communication signal output terminal Out of the MPU 61, and the wire 69b is connected to a communication signal input terminal In of the MPU 61.

Figure 3:
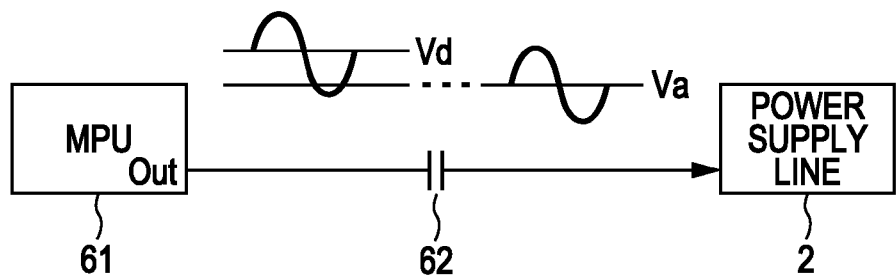
FIG. 3 is a diagram explaining a communication system of the monitoring device illustrated in FIG. 1.

Here, as illustrated in FIG. 3, the AC communication signal output from the communication signal output terminal Out of the MPU 61 is mixed with a DC current having a potential Vd determined in accordance with an arrangement position of the battery cell 11 connected in the assembled battery 1 to thereby produce a mixed signal. Specifically, referring to FIG. 1, the potential at a point P1 in the battery cell 11 arranged at a position near the negative terminal of the assembled battery 1 is lower than the potential at a point Pn in the battery cell 11 arranged at a position far from the negative terminal of the assembled battery 1 (at a position near the positive terminal of the assembled battery 1) by the voltage of the battery cells 11 connected therebetween. This causes a different reference potential of an AC communication signal depending on the voltage detecting circuit 6, and it is difficult for the control circuit 7 to identify the AC communication signal. FIG. 3 is a diagram explaining a communication system (on the output side) in the present example and includes a schematic diagram explaining the functions of the coupling capacitor 62.

In the present example, the coupling capacitor 62 provided on the wire 69 between the communication signal output terminal Out of the MPU 61 and the power supply line 2 allows communication using the power supply line 2. That is, the coupling capacitor 62 (also the coupling capacitor 63 described above) has a function of blocking a DC component and allowing only an AC component to pass therethrough. Thus, as illustrated in FIG. 3, when the mixed signal containing the DC current of the potential Vd and the AC communication signal passes through the coupling capacitor 62, the DC component is removed to obtain only the AC communication signal of the reference potential Va described above, and this AC communication signal is sent to the power supply line 2. Therefore, AC communication signals having the same potential are sent to the power supply line 2 from the individual voltage detecting circuits 6 of the battery cells 11 regardless of the arrangement positions of the battery cells 11 in the assembled battery 1 so that the control circuit 7 can identify the communication signals.

Referring back to FIG. 2, resistors 651 and 652 and a capacitor 653, which may be parts of a band-pass filter 65, are provided in the wire 69b connected to the communication signal input terminal In of the MPU 61. The band-pass filter 65 is a filter circuit having both a high-pass filter function for removing noise of a low-frequency band to extract only a signal of a high-frequency band, and a low-pass filter function for removing noise of a high-frequency band to extract only a signal of a low-frequency band. In FIG. 2, the band-pass filter 65 also includes a rectifying diode 654.

The band-pass filter 65 in the present example is a filter circuit for extracting a signal of a specific frequency band for communication with the control circuit 7 among various signals (noise) flowing in the power supply line 2.

Figure 4:
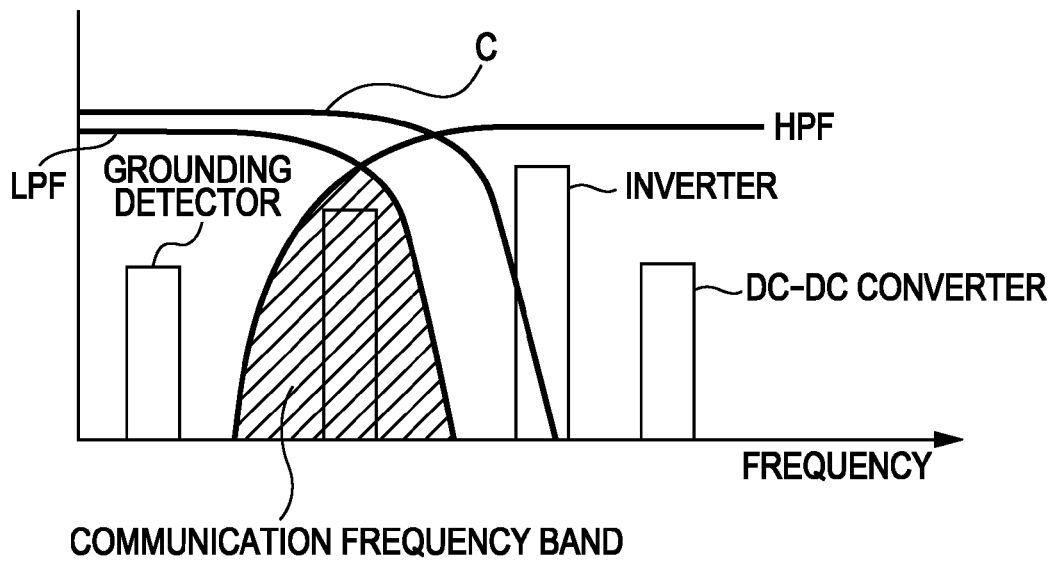
FIG. 4 is a diagram explaining a communication frequency band of the monitoring device illustrated in FIG. 1.

FIG. 4 is a diagram explaining a communication frequency band that is used for the monitoring device 5 according to the present example. In the communication system in the present example, since an AC communication signal flows in a power supply line, the frequencies that can be used need to be frequencies in which signals can pass through the battery cells 11. This frequency band is different depending on the configuration of the battery cell 11. In FIG. 4, the frequency band is represented by reference symbol C. When other AC signals flow in the power supply line 2, the frequency band C needs to be a frequency band that does not overlap those of the AC signals.

AC signals from a grounding detector 8 (see FIG. 1, a specific example configuration of which is disclosed in, for example, Japanese Unexamined Patent Application Publication No. 2003-250201) for detecting the grounding of the assembled battery 1, the inverter 3 and a DC/DC converter (not illustrated) coexist in the power supply line 2. The frequency bands of the AC signals produced from the individual devices are illustrated in FIG. 4. Since a frequency band (indicated by hatching in FIG. 4) provided between the frequency bands for the grounding detector 8 and the inverter 3 is relatively large, this frequency band can be used as the frequency band of communication signals between the voltage detecting circuits 6 and the control circuit 7.

In the present example, a high-pass filter HPF for removing noise from the grounding detector 8 and a low-pass filter LPF for removing noise from the inverter 3 are used to extract only signals of this frequency band from signals input through the power supply line 2 and the wires 611, 69 and 69b, and the extracted signals are input to the communication signal input terminal In of the MPU 61. An AC communication signal to be output from the communication signal output terminal Out of the MPU 61 is generated by the MPU 61 as a signal in this frequency band.

Figure 5:
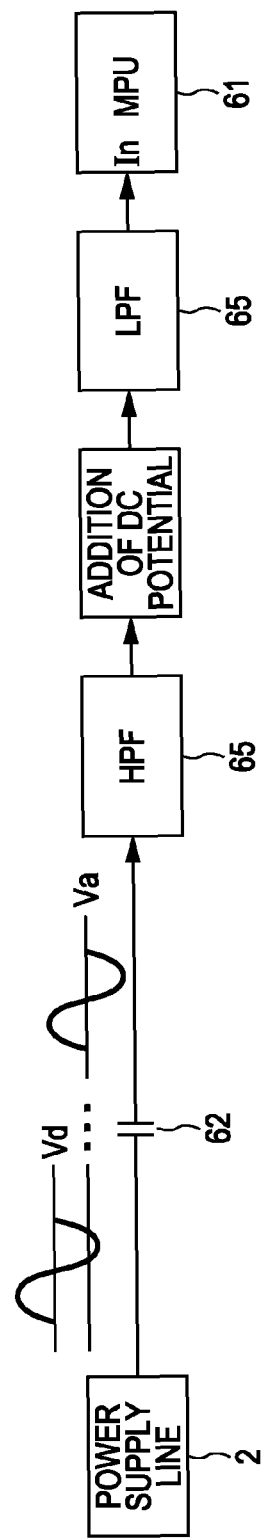
FIG. 5 is a diagram explaining a communication system of the monitoring device illustrated in FIG. 1.
Figure 6:
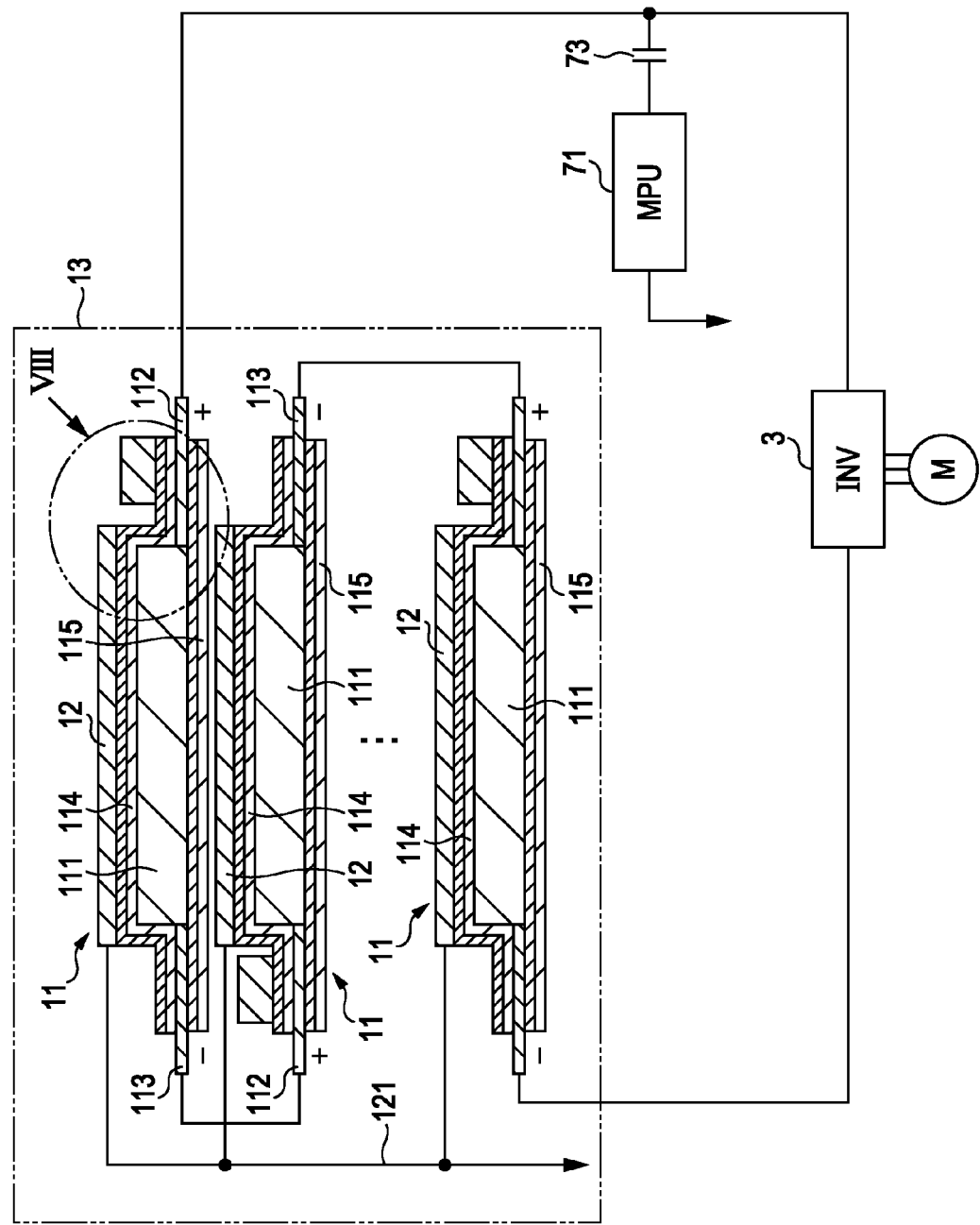
FIG. 6 is a cross-sectional view of an assembled battery illustrated in FIG. 1.

FIG. 5 is a diagram explaining a communication system (on the input side) in the present example and schematically illustrates a process for extracting an AC communication signal using the band-pass filter 65 described above. An AC communication signal transmitted through the power supply line 2 is processed by the coupling capacitor 62 so that the DC component is blocked to obtain an AC communication signal having the reference potential Va. The resulting AC communication signal is processed by the band-pass filter 65 having the high-pass filter HPF and the low-pass filter LPF so that only an AC communication signal in a specific frequency band can be extracted. The MPU 61 is designed to identify an AC communication signal on the basis of the DC potential of the corresponding battery cell 11 that is connected to the ground terminal GND1. Thus, the AC communication signal extracted by the band-pass filter 65 is sent to the communication signal input terminal In of the MPU 61 after the DC potential of the corresponding battery cell 11 is added to the AC communication signal.

In the present example, the frequency band between the frequency bands for the grounding detector 8 and the inverter 3 is used as a communication frequency band. However, any other frequency band in which signals can pass through the battery cells 11 can be set as a communication frequency band in accordance with the system to which the assembled battery 1 is applied.

Further, in the present example, the communication signal output terminal Out and communication signal input terminal In of the MPU 61 are connected to the positive terminal of the battery cell 11 in order to perform information communication with the control circuit 7. The communication signal output terminal Out and communication signal input terminal In may also be connected to the negative terminal of the battery cell 11 so that a communication signal can be transmitted to or received from the negative terminal.

Referring back to FIG. 2, a wire 66a is connected in parallel to the wire 611 connected to the positive terminal of the battery cell 11 through a capacity adjustment resistor 66. The other end of the wire 66a is connected to a capacity adjustment terminal A of the MPU 61. The capacity adjustment terminal A and the ground terminal GND1 are turned on for a predetermined period of time in accordance with a command signal from the control circuit 7, thereby allowing a current from the battery cell 11 to flow through the resistor 66. Therefore, the battery capacity of the battery cell 11 can be adjusted to a predetermined amount.

Furthermore, each of the voltage detecting circuits 6 is provided with a memory 67 that may be formed of a non-volatile semiconductor memory or the like. The memory 67 stores a unique identifier of the battery cell 11 to be detected. When a detected voltage value is converted into an AC signal and output, the unique identifier stored in the memory 67 is added as a header of the AC signal and is then sent to the control circuit 7. Accordingly, the control circuit 7 can identify with which battery cell 11 information about the sent voltage value is associated. Further, a capacity adjustment command signal sent from the control circuit 7 also has a unique identifier of the battery cell 11 to be detected. The voltage detecting circuit 6 compares the unique identifier contained in the capacity adjustment command signal with the unique identifier stored in the memory 67 to determine whether the command is directed to the voltage detecting circuit 6.

Referring back to FIG. 1, the control circuit 7 includes an MPU 71, a wire 72 for connecting a communication signal output terminal and communication signal input terminal of the MPU 71 to the power supply line 2 and a wire 74 for connecting a communication signal ground terminal of the MPU 71 to a ground point such as a battery case for accommodating the assembled battery 1 in the present example. A coupling capacitor 73 is provided in the wire 72.

The MPU 71 receives the voltage values across the terminals of the individual battery cells 11, which are detected by the voltage detecting circuits 6 described above, to determine the battery capacity of the assembled battery 1, and executes total control for preventing overcharge or overdischarge. Thus, the MPU 71 sends a command signal to the voltage detecting circuits 6 for detecting the voltages of the battery cells 11. As described with reference to FIG. 4, the command signal is generated as an AC communication signal of a specific frequency band (the hatched portion illustrated in FIG. 4). Then, the DC component is blocked by the coupling capacitor 73 provided in the wire 72, and a resulting signal is sent to the power supply line 2 as an AC communication signal having the same reference potential Va as that of the voltage detecting circuits 6.

Instead of outputting a command signal for detecting the voltages of the battery cells 11, each of the voltage detecting circuits 6 may have a clock function so that detected voltage values can be automatically sent from the voltage detecting circuits 6 to the control circuit 7 at predetermined time intervals.

The MPU 71 reads AC communication signals corresponding to the voltage values of the battery cells 11, which are sent from the respective voltage detecting circuits 6, and analyzes the voltage values together with unique identifiers of the battery cells 11 contained in the AC communication signals. If the difference between battery capacities is equal to or greater than a predetermined threshold value, the MPU 71 sends a command signal to the voltage detecting circuit 6 corresponding to a target battery cell 11. This causes a current to flow in the capacity adjustment resistor 66 for a predetermined period of time to perform control so that, for example, the capacities of the battery cells 11 constituting the assembled battery 1 can be made uniform. The capacity adjustment command signal output at this time has the unique identifier of the battery cell 11 to be subjected to capacity adjustment. Each of the voltage detecting circuits 6 compares the unique identifier contained in the capacity adjustment command signal with the unique identifier stored in the memory 67 to determine whether the command is directed to the voltage detecting circuit 6.

Since each of the voltage detecting circuits 6 has the coupling capacitors 62 and 63, the coupling capacitor 73 of the control circuit 7 can be omitted.

According to the monitoring device 5 for the assembled battery 1 in the present embodiment, therefore, information is exchanged between the voltage detecting circuits 6 and the control circuit 7 through the power supply line 2. Thus, a conventionally necessary dedicated wire is not required for information communication, and the cost of the wire, the assembly work for providing the wire, and the space for the wire can be reduced accordingly.

Furthermore, even if the DC potentials of the AC communication signals sent from the voltage detecting circuits 6 are different from each other, the coupling capacitors 63 provide an equal reference potential, and the reference potential is sent to the power supply line 2 through the coupling capacitors 62. Therefore, AC communication signals having the same potential can be obtained.

Furthermore, even if the AC communication signals received through the power supply line 2 contain signals of various frequency bands, AC communication signals of a specific frequency band are extracted using the band-pass filters 65. This can facilitate communication between the voltage detecting circuits 6 and the control circuit 7.

Furthermore, the unique identifiers of the battery cells 11 are added to the AC communication signals when communication is performed between the voltage detecting circuits 6 and the control circuit 7. Therefore, the voltage detecting circuit 6 of the desired battery cell 11 can be specified from among the plurality of voltage detecting circuits 6.

The battery cells 11 may be configured as thin battery cells or the like in order to reduce the size of the assembled battery 1. In this case, in each of the voltage detecting circuits 6 described above, circuit elements such as the MPU 61, the memory 67, the capacitors 62, 63, 643 and 653, and the diode 654 may be arranged in the gap between the stacked battery cells 11, resulting in saving of space.

The capacitors 62, 63, 643 and 653 can be configured as ceramic capacitors or the like. In general, a ceramic capacitor has dimensions of about 2 mm×about 1.25 mm×about 0.6 mm, and their presence may impede the saving of space. In the present embodiment, therefore, exterior members 114 and 115 of each of the battery cells 11 are used as capacitors.

Embodiments illustrated in FIGS. 6 to 10 relate to examples in which the coupling capacitors 63 of the voltage detecting circuits 6 described above are implemented using exterior members in place of ceramic capacitors. The grounding detector 8 shown in FIG. 1 is not illustrated in FIG. 6 for simplicity.

A battery cell 11 in the present example may be a thin flat lithium secondary battery cell. The battery cell 11 includes a power generating element 111, a positive electrode tab 112 serving as a positive electrode terminal, a negative electrode tab 113 serving as a negative electrode terminal, an upper exterior member 114 and a lower exterior member 115.

Although not illustrated in detail, the power generating element 111 is configured such that positive plates connected to the positive electrode tab 112 and coated with a positive active material and negative plates connected to the negative electrode tab 113 and coated with a negative active material are alternately laminated with insulating separators therebetween. A bipolar battery cell can also be used.

Figure 8:
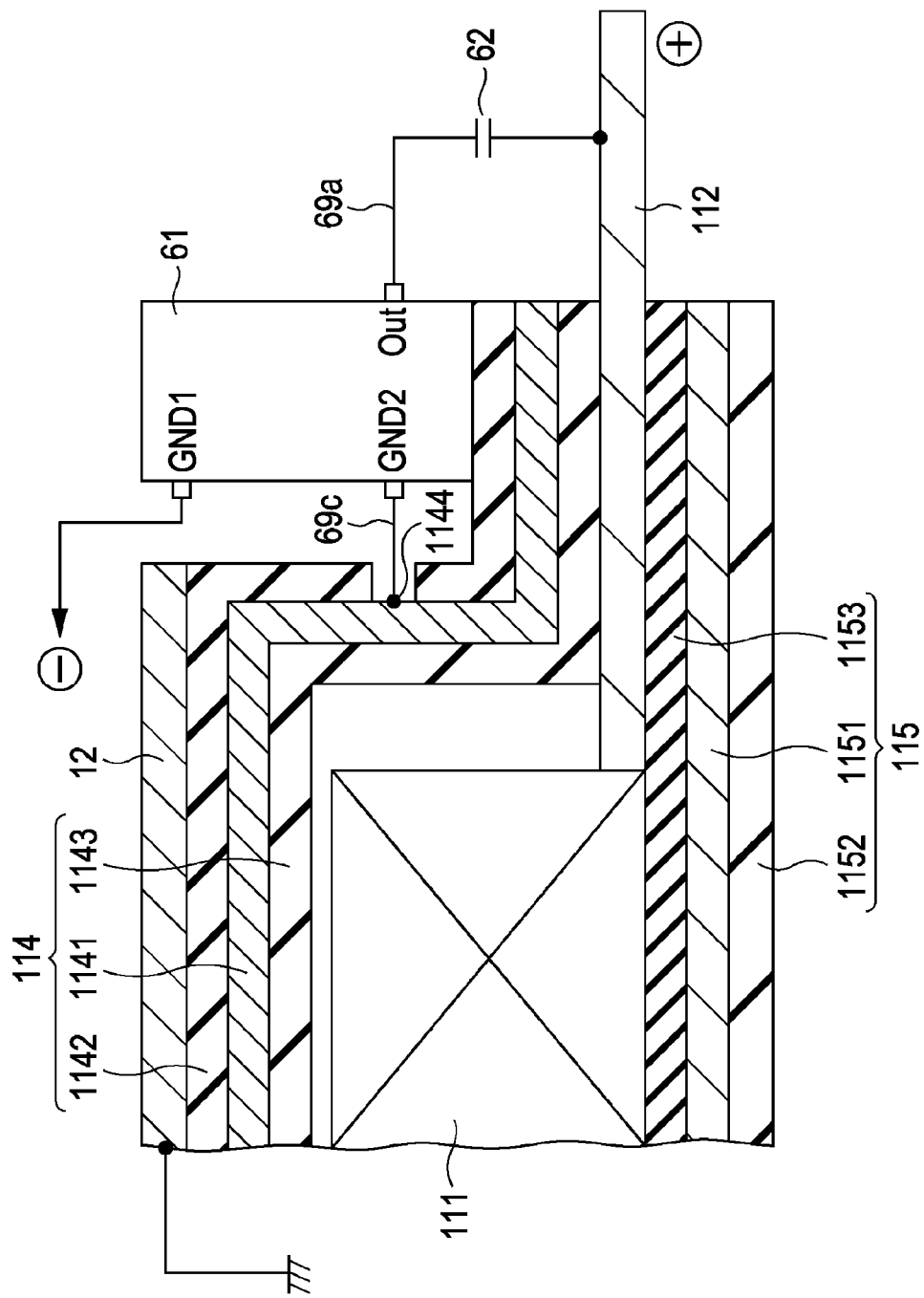
FIG. 8 is an enlarged cross-sectional view of a portion VIII part FIG. 6.

As illustrated in FIG. 8, each of the upper exterior member 114 and the lower exterior member 115 may be configured such that one surface (the inner surface of the battery cell 11) of a metal foil such as an aluminum foil is laminated with a resin such as polyethylene, modified polyethylene, polypropylene, modified polypropylene or ionomer and the other surface (the outer surface of the battery cell 11) is laminated with a polyamide resin or polyester resin and is flexible. In the illustrations of FIGS. 8 and 9, the metal foil of the upper exterior member 114 serves as a conductive layer 1141, the battery cell outer surface of the upper exterior member 114 serves as an insulating layer 1142, and the battery cell inner surface of the upper exterior member 114 serves as an insulating layer 1143. Further, the metal foil of the lower exterior member 115 serves as a conductive layer 1151, the battery cell outer surface of the lower exterior member 115 serves as an insulating layer 1152, and the battery cell inner surface of the lower exterior member 115 serves as an insulating layer 1153.

In the present example, the upper exterior member 114 is formed into a recess with a depth corresponding to the thickness of the power generating element 111 while the lower exterior member 115 is formed into a flat plate. Both the upper exterior member 114 and the lower exterior member 115 can be formed into recesses. Alternatively, the upper exterior member 114 can be formed into a flat plate and the lower exterior member 115 can be formed into a recess.

Figure 7:
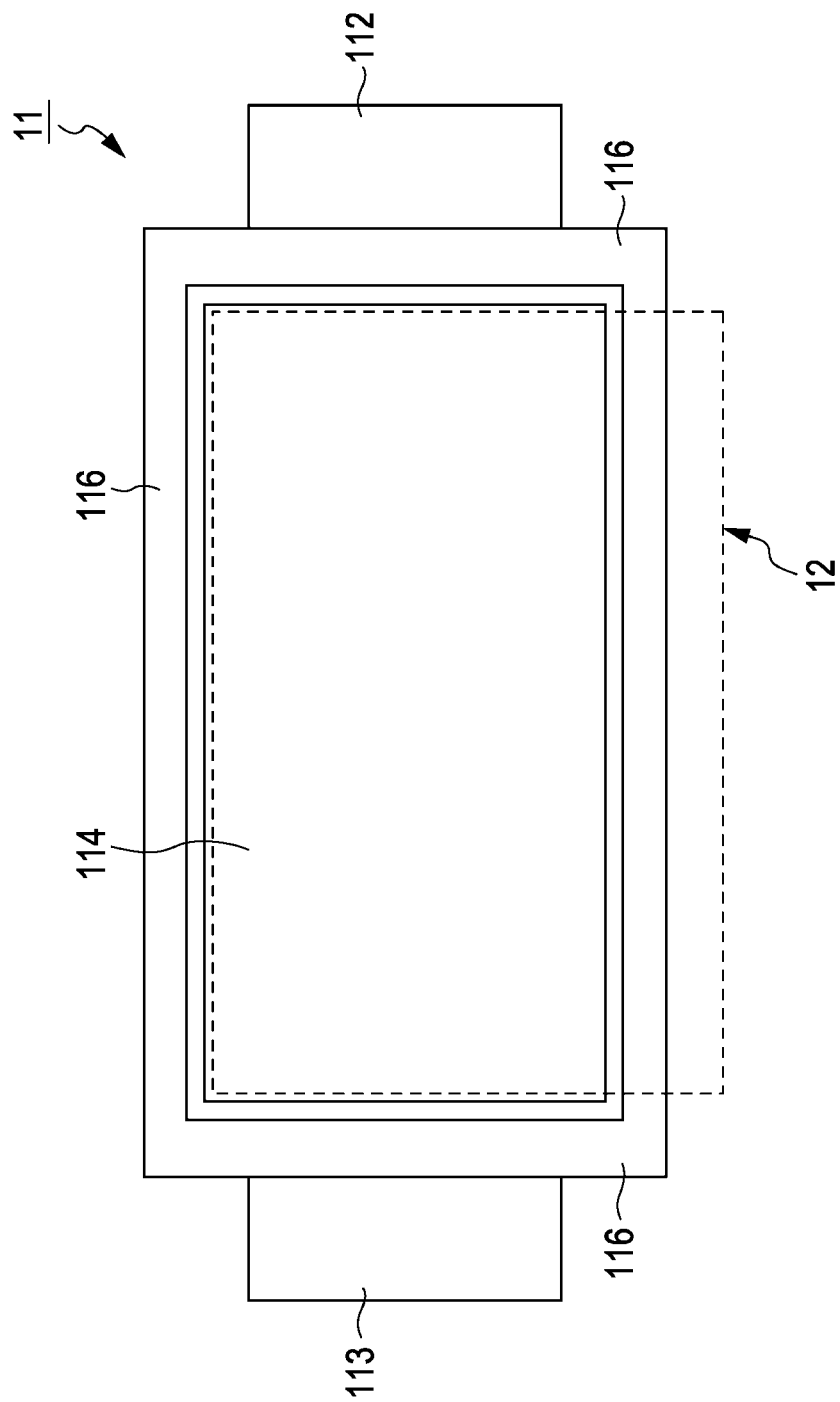
FIG. 7 is a plan view of a battery cell illustrated in FIG. 6.

Then, the power generating element 111, a part of the positive electrode tab 112 and a part of the negative electrode tab 113 are covered with the upper exterior member 114 and the lower exterior member 115. While a liquid electrolyte containing a lithium salt such as lithium perchlorate, lithium fluoroborate or lithium phosphate hexafluoride as a solute in an organic liquid solvent is injected into a space defined by the exterior members 114 and 115, this space is vacuum sealed. Subsequently, the entire outer peripheral edges of the exterior members 114 and 115 are heat-sealed by heat press and sealed. In FIG. 7, a joint portion 116 is a portion where the upper exterior member 114 and the lower exterior member 115 are joined together by heat seal.

As illustrated in FIG. 7, both the upper exterior member 114 and the lower exterior member 115 have areas that are substantially equal to the dimensions of the plane of the power generating element 111. The insulating layers 1142, 1143, 1152 and 1153 are composed of polyethylene, modified polyethylene, polypropylene, modified polypropylene, ionomer resin, polyamide resin, polyester resin, or the like. In particular, a polypropylene dielectric has a high dielectric constant. Furthermore, since the battery cell 11 is a thin battery cell, the vertical distance between the exterior members 114 and 115 is short.

The capacitance C of a capacitor is proportional to the dielectric constant $\in$ of a dielectric and the area A of an electrode and is inversely proportional to the distance d between electrodes ($C \propto \in \cdot A/d$). Therefore, one of the conductive layer 1141 of the exterior member 114 and the conductive layer 1151 of the exterior member 115 of the battery cell 11 is used as one electrode of a capacitor, and the other electrode of the capacitor is provided outside the battery cell 11, whereby a large-capacitance capacitor in which insulating layers are used as charge accumulation units can be realized.

In the present example, as illustrated in FIG. 7, a communication electrode 12 that constitutes one electrode of a coupling capacitor 63 is disposed on an outer surface of the upper exterior member 114 of each battery cell 11. Further, as illustrated in FIG. 8, a communication-signal ground terminal GND2 of an MPU 61 and a connection section 1144 in the conductive layer 1141 of the upper exterior member 114 are connected through a wire 69c so that the conductive layer 1141 of the upper exterior member 114 can serve as the other electrode of the coupling capacitor 63.

The communication electrode 12 may be formed of, like the conductive layer 1141, a metal foil such as an aluminum foil or copper foil. As illustrated in the plan view of FIG. 7, the communication electrode 12 is configured to have an area equivalent to the area of the power generating element 111. Further, the communication electrode 12 is bonded to the outer surface of the upper exterior member 114 using an adhesive or the like so as to project from a side (in the battery shape illustrated in FIG. 7, a long side) where the electrode tabs 112 and 113 of the battery cell 11 are not led.

The communication electrode 12 is bonded to the outer surface of the upper exterior member 114 of each battery cell 11. When the battery cells 11 are overlaid on each other in the manner illustrated in FIG. 6, all the communication electrodes 12 are provided so as to project from the same side. Then, the communication electrodes 12 are connected through a single wire 121 and are electrically connected to a battery case 13. Therefore, the reference potentials Va of the coupling capacitors 63 become equal to the potential of the battery case 13, that is, the ground potential, and the amount of assembly work can be reduced.

The communication-signal ground terminal GND2 of the MPU 61 is connected to the connection section 1144 in the conductive layer 1141 of the upper exterior member 114. The communication electrode 12 is bonded to the outer surface of the upper exterior member 114 and is connected to the battery case 13. With this configuration, a coupling capacitor 63 in which the insulating layer 1142 of the upper exterior member 114 corresponds to a dielectric (charge accumulation unit), and in which the conductive layer 1141 and the communication electrode 12 correspond to both electrodes, can be realized.

Due to the high dielectric constant $\in$ of the resin that forms the insulating layer 1142, the short distance between the conductive layer 1141 and the communication electrode 12, and the large opposing area between the conductive layer 1141 and the communication electrode 12, a coupling capacitor 63 having a large capacitance can be obtained. In addition, since the coupling capacitor 63 is formed of the upper exterior member 114 and the communication electrode 12 formed of a thin film, the arrangement space for the coupling capacitor 63 can be reduced.

In the present example, the connection portion of the communication electrode 12 may not necessarily be a ground portion, and may be a portion with a stable potential as a reference potential Va for communication signals. The communication electrode 12 can also be bonded to the outer surface of the lower exterior member 115, and the communication-signal ground terminal GND2 of the MPU 61 can be connected to the conductive layer 1151 of the lower exterior member 115.

In the present embodiment, as described previously, one end of the coupling capacitor 63 is connected to the communication-signal ground terminal GND2 of the MPU 61, and the other end thereof is connect to a ground point such as a battery case for accommodating the assembled battery 1.

According to the present embodiment, since it is only required to dispose the communication electrodes 12 without directly performing any electrical wiring operation on the battery cells 11, advantageously, assembly of the battery cells 11 is simple. In this case, it is further necessary to connect the communication electrodes 12 to a battery case. However, if the communication electrodes 12 are prepared and connected in advance during the manufacturing of the battery case, electrically connecting the communication electrodes 12 to the battery cells 11 is not required, at least when the battery cells 11 are accommodated in the battery case, resulting in a simple operation.

In the example illustrated in FIG. 8, the coupling capacitor 63 is formed of the insulating layer 1142 and conductive layer 1141 of the upper exterior member 114 and the communication electrode 12. Since the battery cell 11 is a thin battery cell, one of the electrodes can be implemented by the conductive layer 1151 of the lower exterior member 115. FIG. 9 is a cross-sectional view illustrating this modification, and it corresponds to the diagram of FIG. 8.

In the second embodiment illustrated in FIG. 9, the communication-signal ground terminal GND2 of the MPU 61 is connected to a connection section 1154 in the conductive layer 1151 of the lower exterior member 115 through a wire 69c. As in the embodiment illustrated in FIG. 8, the communication electrode 12 is bonded to the outer surface of the upper exterior member 114.

Therefore, two capacitors that are connected in series are formed between the conductive layer 1151 and the communication electrode 12. That is, one of the capacitors is a capacitor in which the insulating layer 1142 of the upper exterior member 114 serves as a dielectric (charge accumulation unit) and the communication electrode 12 and the conductive layer 1141 of the upper exterior member 114 serve as the electrodes. The other capacitor is a capacitor in which the insulating layer 1153 of the lower exterior member 115 serves as a dielectric (charge accumulation unit) and the conductive layer 1151 of the lower exterior member 115 and the conductive layer 1141 of the upper exterior member 114 serve as the electrodes.

In the present example, the distance between the conductive layer 1141 and the communication electrode 12 is longer than that in the example illustrated in FIG. 8. However, the dielectric constant $\in$ of the resin that forms the insulating layer 1142 is large, and the opposing area between the conductive layers 1141 and 1151 and the communication electrode 12 is large. Therefore, a coupling capacitor 63 having a large capacitance can be obtained. In addition, since a coupling capacitor 62 is formed of the exterior members 114 and 115 and the communication electrode 12 formed of a thin film, the arrangement space for the coupling capacitor 63 can be significantly reduced.

Note that wires and electronic components in the voltage detecting circuits 6 illustrated in FIGS. 1 and 2, except for the coupling capacitors 63 described above, can be formed by a flexible wiring substrate 600.

The embodiments illustrated in FIGS. 8 and 9 relate to the examples in which the coupling capacitor 63 of the voltage detecting circuit 6 illustrated in FIG. 2 is formed in the exterior members 114 and 115 of the battery cell 11. The third embodiment illustrated in FIG. 10, on the contrary, relates to an example in which the coupling capacitor 62 illustrated in FIG. 2 is formed in the exterior member 114 of the battery cell 11.

As illustrated in FIG. 10, the communication signal output terminal Out of the MPU 61 and the connection section 1144 in the conductive layer 1141 of the upper exterior member 114 are connected through a wire 69a.

Thus, a coupling capacitor 62 in which the insulating layer 1143 of the upper exterior member 114 corresponds to a dielectric (charge accumulation unit) and the conductive layer 1141 and the positive electrode tab 112 correspond to both electrodes is realized.

The opposing area between the conductive layer 1141 and the positive electrode tab 112 is slightly smaller than that in the example illustrated in FIG. 8; however, the dielectric constant ∈ of the resin that forms the insulating layer 1143 is large and the distance between the conductive layer 1141 and the positive electrode tab 112 is short. Therefore, a coupling capacitor 62 having a large capacitance can be obtained. In addition, since the coupling capacitor 62 is formed of the upper exterior member 114 and the positive electrode tab 112, the arrangement space for the coupling capacitor 62 can be reduced.

In FIG. 10, instead of disposing the connection section 1144 in the conductive layer 1141 of the upper exterior member 114, the connection section 1144 may be disposed in the conductive layer 1151 of the lower exterior member 115, and the communication signal output terminal Out of the MPU 61 and the connection section 1144 may be connected through the wire 69a. In this case, the configuration of the first embodiment as illustrated in FIG. 8 may be combined so that the exterior members 114 and 115 can have the functions of the capacitors 62 and 63.

Furthermore, instead of using the capacitors 62 and 63, another capacitor (for example, the capacitor 643 or the like) may be formed in the exterior member 114 or 115.

Figure 11A:
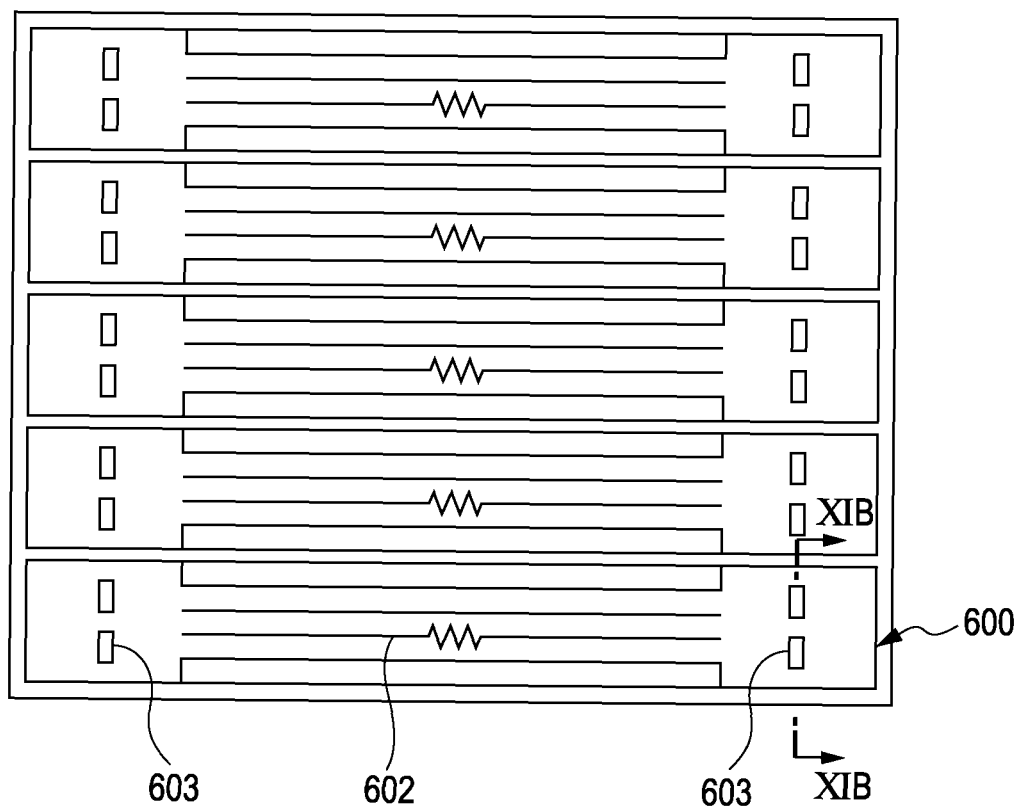
FIGS. 11A and 11B are a plan view and a cross-sectional view, respectively, of a flexible wiring substrate according to an example of the invention.
Figure 11B:
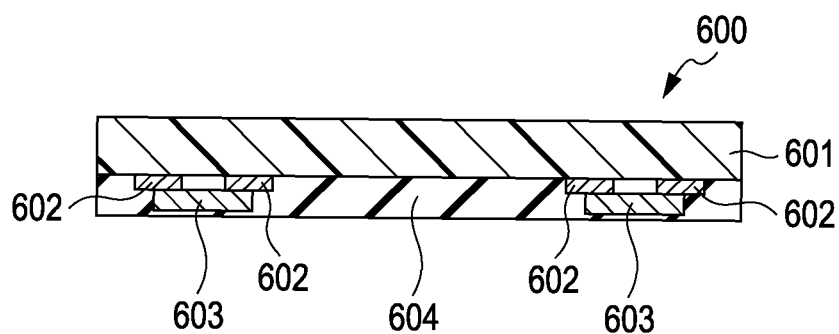
Figure 12:
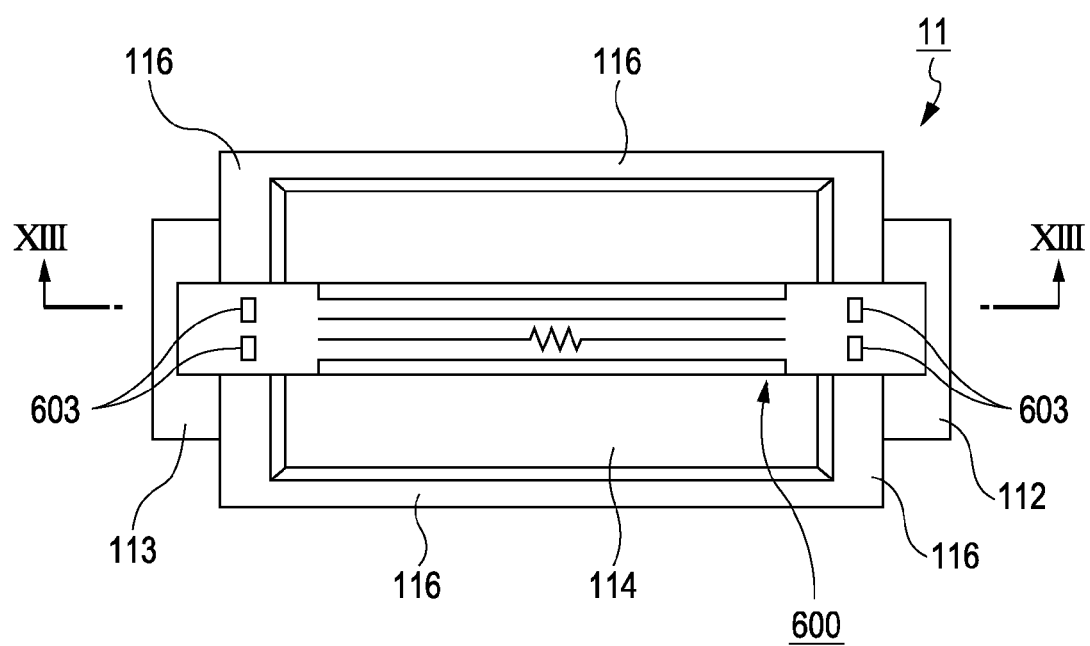
FIG. 12 is a plan view of a battery cell having the flexible wiring substrate illustrated in FIG. 11.

FIGS. 11A and 11B are diagrams illustrating a flexible wiring substrate 600 according to the present embodiment. In the plan view of FIG. 11A, flexible wiring substrates 600 that have not yet been cut out are illustrated. FIG. 12 is a plan view of a battery cell 11 including a flexible wiring substrate 600, and FIG. 13 is a cross-sectional view taking along the line XIII-XIII of FIG. 12.

As illustrated in the cross-sectional view of FIG. 11B, the flexible wiring substrate 600 in the present example is configured such that a wiring pattern 602 including a resistor is formed on an insulating sheet 601 such as a polyimide resin substrate by a conductive material such as copper, and further circuit elements (electronic components) 603 other than the coupling capacitors 63 described above, such as an integrated circuit (IC), a capacitor and a diode, are mounted at predetermined positions. Further, the surfaces of these components are coated with an insulating protection film 604 to maintain the insulating properties of the wiring pattern 602 or the circuit elements 603.

FIG. 11A is a diagram schematically illustrating wiring patterns 602, resistors and electronic components 603. In actuality, in accordance with the configuration of the voltage detecting circuit 6 illustrated in FIG. 2, a wiring pattern, resistors, an IC that forms an MPU, coupling capacitors and a diode, which are illustrated in FIG. 2, are arranged with a desired layout.

The flexible wiring substrate 600 in the present example is configured by forming the entire substrate into a rectangular shape and forming, as illustrated in FIG. 12, the longitudinal length of the substrate so as to be equal to the distance between the positive electrode tab 112 and negative electrode tab 113 of the battery cell 11. Since the substrate 600 is formed into a rectangular shape, as illustrated in FIG. 11A, a high yield of production from the original plate can be realized. Further, since the substrate 600 is formed into a rectangular shape, the substrate 600 can be easily cut using a punching device.

In the flexible wiring substrate 600 in the present example, furthermore, the wiring pattern of the wire 611 connected to the positive electrode illustrated in FIG. 2 (the connection section connected to the positive electrode tab 112) is formed at one end of the substrate 600, and the wiring pattern of the wire 612 connected to the negative electrode (the connection section connected to the negative electrode tab 113) is formed at the other end of the substrate 600. The wiring pattern illustrated in FIG. 2 is formed therebetween.

Accordingly, as illustrated in FIGS. 12 and 13, the flexible wiring substrate 600, which is formed into a rectangular shape is overlaid on the upper exterior member 114 of the battery cell 11, and both ends of the flexible wiring substrate 600 are electrically connected to the positive electrode tab 112 and the negative electrode tab 113. Therefore, the voltage detecting circuit 6 can be integrally formed with the battery cell 11 only by increasing the thickness of the flexible wiring substrate 600, except for the circuit elements 603.

On the other hand, the circuit elements 603 such as the MPU 61, the memory 67, the capacitors 62, 643 and 653, and the diode 654 illustrated in FIG. 2 are relatively larger in thickness than the substrate 600. Therefore, the circuit elements 603 having a large thickness are provided in a space S in the joint portion 116 between the exterior members 114 and 115 illustrated in FIG. 13.

Specifically, as illustrated in FIG. 13, when the flexible wiring substrate 600 is placed in the battery cell 11, the circuit elements 603 mounted on the flexible wiring substrate 600 are mounted on the substrate 600 in a layout in which the circuit elements 603 are located in the space S. Since the IC chip that forms the MPU 61 is the largest among the circuit elements 603, such a large circuit element is preferentially laid out.

In the example electric circuit illustrated in FIG. 2, the six (or seven, if a capacitor of a clock circuit is included) circuit elements 603 including the MPU 61, the memory 67, the capacitors 62, 643 and 653, and the diode 654 are disposed in the space S.

Furthermore, in the layout of those circuit elements 603 on the substrate 600, the following points may be taken into consideration.

An analog circuit in the voltage detecting circuit 6 illustrated in FIG. 2 is susceptible to noise. Therefore, the resistors 651 and 652, the capacitor 653 and the diode 654 that constitute the band-pass filter 65 for removing noise are laid out at positions near the positive electrode tab 112 of the battery cell 11 that transmits and receives an AC communication signal. In the present example, an input/output terminal for a communication signal is connected to the positive electrode of the battery cell 11. Thus, the band-pass filter 65 is provided at a position as close to the positive electrode tab 112 as possible, thereby reducing the range affected by noise.

On the other hand, components relatively less affected by noise, such as the MPU 61 and the memory 67, may be provided in any portion including a portion on the positive electrode side or a portion on the negative electrode side as necessary. In the layout of the flexible wiring substrate 600, if the arrangement space on the positive electrode side is small because the band-pass filter 65 is provided on the positive electrode side, the above components can be provided on the negative electrode side. In particular, in order to increase the yield of production from the original plate by forming the substrate 600 into a rectangular shape, preferably, the two circuit elements 653 and 654 in the band-pass filter 65 are provided on the positive electrode side and the remaining four (or five) circuit elements including the MPU 61 are arranged on the positive and negative electrode sides as desired.

Figure 14A:
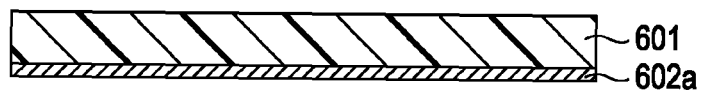
FIGS. 14A to 14D are cross-sectional views illustrating a method for producing the flexible wiring substrate illustrated in FIG. 11.
Figure 14B:
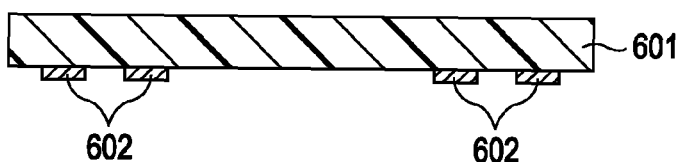

In order to produce the flexible wiring substrate 600 in the present example, first, as illustrated in FIG. 14A, an original plate having a conductive foil 602a such as a copper foil formed thereon is prepared on the entirety of one principal surface of the insulating sheet 601 of polyimide resin or the like. The copper foil on the original plate is etched using a mask corresponding to a desired wiring pattern and an etching agent to form a wiring pattern 602 including lands on which resistors and electronic components are mounted as shown in FIG. 14B. The copper foil is left on both ends of the substrate so as to be joined to the positive electrode tab 112 and negative electrode tab 113 of the battery cell 11.

Figure 14C:
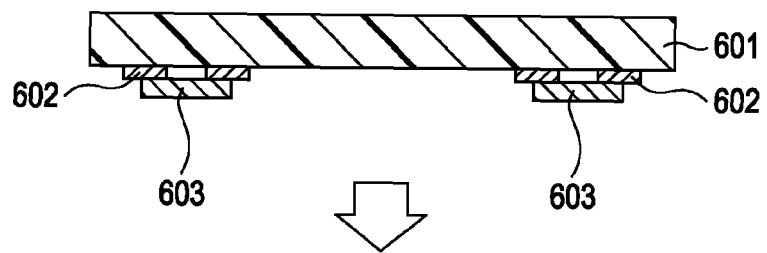
Figure 14D:
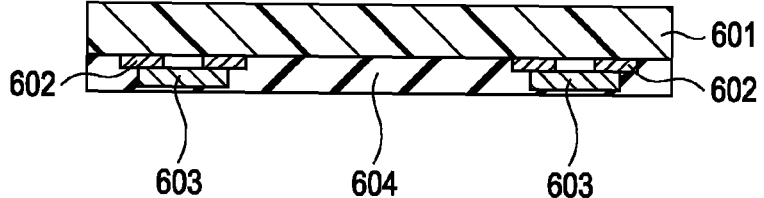

Then, the circuit elements 603 such as an IC chip, a capacitor and a diode are mounted on the lands formed at the predetermined positions by soldering or the like with reference to FIG. 14C. Then, the wiring pattern 602 and the circuit elements 603 are covered with an insulating protection film 604 and are fused and coated by heat press or the like to obtain the structure of FIG. 14D. At this time, the copper foil in the joint portions between the positive electrode tab 112 and the negative electrode tab 113 at both ends of the substrate 600 is not coated with the insulating protection film 604.

The above steps are performed so that, as illustrated in FIG. 11A, a plurality of flexible wiring substrates 600 can be formed on a single original plate. In the next step, thus, the original plate is cut to obtain one flexible wiring substrate 600.

Finally, the obtained flexible wiring substrate 600 is joined to the positive electrode tab 112 and the negative electrode tab 113 of one of the battery cells 11 described above using ultrasonic welding, laser welding, or the like. It is only required that both ends of the flexible wiring substrate 600 be joined to the positive electrode tab 112 and the negative electrode tab 113 of the battery cell 11, and a portion therebetween may or may not be joined. In particular, in a case where the battery cells 11 are stacked to form the assembled battery 1, the flexible wiring substrates 600 can be fixed by pressure by the battery cells 11 even if the intermediate portions of the flexible wiring substrates 600 are not joined to the battery exteriors.

Accordingly, with the use of the flexible wiring substrate 600 of the present embodiment, as illustrated in FIG. 13, even in a case where the battery cells 11 are stacked to form the assembled battery 1, the thickness is increased only by the thickness of the substrates 600, except for the circuit elements 603. The increase in the thickness of the assembled battery 1 can be prevented. Then, the voltage detecting circuits 6 are produced on the flexible wiring substrates 600 and are integrally attached to the individual battery cells 11. Therefore, it is sufficient that the remaining control circuit 7 in the monitoring device 5 be provided in a space available in a battery case. That is, unlike the related art, a large control substrate collectively including a control circuit and voltage detecting circuits can be omitted, and an assembled battery with a reduced size can be realized.

Furthermore, since the circuit elements 603 are disposed in the space S in the joint portion 116 of each of the battery cells 11, extra load can be prevented from being imposed on the circuit elements 603. In addition, the exterior members 114 and 115 of each of the battery cells 11 can also be prevented from being damaged by the circuit elements 603.

Furthermore, since each of the flexible wiring substrates 600 is formed into a rectangular shape, a high yield of material of the original plate can be achieved and a reduction in cost can also be expected.

Moreover, since the circuit elements 603 that constitute the band-pass filter 65 are laid out at positions near the positive electrode tab 112 of each of the battery cells 11 that transmits and receives an AC communication signal, the influence of noise on an analog circuit can be reduced.

The above-described embodiments have been described in order to allow easy understanding of the present invention, and do not limit the present invention. On the contrary, the invention is intended to cover various modifications and equivalent arrangements included within the scope of the appended claims, which scope is to be accorded the broadest interpretation so as to encompass all such modifications and equivalent structures as is permitted under the law.

What is claimed is:
1. A battery cell comprising:
a power generating element comprised of a plurality of positive plates coated with a positive active material and a plurality of negative plates coated with a negative active material, the positive plates and negative plates alternately laminated with separators there between;
an exterior member configured to overlay the power generating element, the exterior member including an insulating layer and a conductive layer, the conductive layer being disposed between the power generating element and the insulating layer, and the conductive layer including a connection section configured to be electrically connected external to the battery cell; and
a conductive member overlaying and bonded to the insulating layer of the exterior member and configured to be electrically connected external to the battery cell, wherein the power generating element is connected to a positive electrode tab extending exterior to the exterior member and a negative electrode tab extending exterior to the exterior member.

2. The battery cell according to claim 1, wherein
the conductive member is a communication electrode;
the insulating layer is located between the communication electrode and the conductive layer and functions as a dielectric material for a capacitor configured to accumulate charge; and
the communication electrode and conductive electrode function as terminals of the capacitor.

3. The battery cell according to claim 2, wherein
the exterior member further includes first and second exterior sheet members, the first and second exterior sheet members having outer peripheral edges joined together to enclose the power generating element between the first and second exterior sheet members;
each of the first and second exterior sheet members has a structure including a conductive layer and insulating layers laminated on opposing surfaces of the conductive layer;
the connection section is located in the conductive layer of one of the first exterior sheet member and the second exterior sheet member; and
the communication electrode is located on an outside facing side of the first exterior sheet member.

4. The battery cell according to claim 1, wherein
the conductive member is electrically connected to the power generating element;
the insulating layer is a dielectric material configured to accumulate charge as a capacitor; and
the electrode and conductive layer function as terminals of the capacitor.

5. The battery cell according to claim 4, wherein
the exterior member further includes first and second exterior sheet members, the first and second exterior sheet members having outer peripheral edges joined together to enclose the power generating element between the first and second exterior sheet members;
each of the first and second exterior sheet members has a structure including a conductive layer and insulating layers laminated on opposing surfaces of the conductive layer; and the connection section is located in the conductive layer of at least one of the first exterior sheet member and the second exterior sheet member.

6. The battery cell according to claim 1, wherein the member is at least one of a microprocessor and a detection unit.

7. A battery assembly unit, comprising:
an assembled battery including a plurality of battery cells, each battery cell including:
   a power generating element comprised of a plurality of positive plates coated with a positive active material and a plurality of negative plates coated with a negative active material, the positive plates and the negative plates alternately laminated with separators there between;
   an exterior member configured to cover the power generating element, the exterior member including an insulating layer and a conductive layer, the conductive layer being disposed between the insulating layer and the power generating element, and the conductive layer including a connection section configured to be electrically connected external to the battery cell; and
   a conductive member overlaying and bonded to the insulating layer of the exterior member and configured to be electrically connected external to the battery cell, wherein the power generating element is connected to a positive electrode tab extending exterior to the exterior member and a negative electrode tab extending exterior to the exterior member; and
a detection unit configured to detect voltages of the plurality of battery cells, the detection unit being electrically connected to the connection section of at least one battery cell.

8. The battery assembly unit according to claim 7, wherein the detection unit has a reference-potential terminal connected to the connection section in the conductive layer; and
the conductive member is a communication electrode connected to a member for determining a reference potential of an alternating-current communication signal.

9. The battery assembly unit according to claim 8, wherein the exterior member further includes first and second exterior sheet members, the first and second exterior sheet members having outer peripheral edges joined together to enclose the power generating element between the first and second exterior sheet members;
each of the first and second exterior sheet members has a structure including a conductive layer and insulating layers laminated on opposing surfaces of the conductive layer;
the connection section is located in the conductive layer of one of the first exterior sheet member and the second exterior sheet member; and
the communication electrode is located outside the first exterior sheet member.

10. The battery assembly unit according to claim 7, wherein
the detection unit has a communication signal terminal connected to the connection section in the conductive layer of the one of the first sheet-like exterior member and the second sheet-like exterior member.

11. The battery assembly unit according to claim 10, wherein
the exterior member further includes first and second exterior sheet members, the first and second exterior sheet members having outer peripheral edges joined together to enclose the power generating element between the first and second exterior sheet members;
each of the first and second exterior sheet members has a structure including a conductive layer and insulating layers laminated on opposing surfaces of the conductive layer; and
the connection section is located in the conductive layer of at least one of the first exterior sheet member and the second exterior sheet member.

12. The battery assembly unit according to claim 7, further comprising:
a power supply line configured to electrically connect the plurality of battery cells; and
a control unit configured to adjust capacities of the plurality of battery cells, wherein
the detection unit converts the detected voltages into alternating-current communication signals and sends the alternating-current communication signals to the control unit through the power supply line; and
the control unit adjusts the capacities of the plurality of battery cells in accordance with the detected voltages.

13. The battery assembly unit according to claim 12, wherein
the control unit sends an alternating-current communication signal for controlling the detection unit to the detection unit through the power supply line.

14. The battery assembly unit according to claim 13, wherein
the detection unit includes a resistor for adjusting the capacities of the plurality of battery cells.

15. The battery assembly unit according to claim 7, wherein
the detection unit includes a filter circuit configured to remove noise from the power converter.

16. The battery assembly unit according to claim 7, wherein
the detection unit includes a filter circuit configured to remove noise from the grounding detector.

17. The battery assembly unit according to claim 7, wherein
the detection unit includes a storage unit configured to store a unique identifier of a battery cell to be detected.

* * * * *